United States Patent
Chen

(10) Patent No.: US 9,191,185 B2
(45) Date of Patent: Nov. 17, 2015

(54) DIFFERENTIAL BANG-BANG PHASE DETECTOR USING STANDARD DIGITAL CELLS

(71) Applicant: QUALCOMM Incorporated, San Diego, CA (US)

(72) Inventor: Jia-yi Chen, Sunnyvale, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/268,120

(22) Filed: May 2, 2014

(65) Prior Publication Data

US 2015/0215110 A1 Jul. 30, 2015

Related U.S. Application Data

(60) Provisional application No. 61/932,088, filed on Jan. 27, 2014.

(51) Int. Cl.
| | |
|---|---|
| H04L 7/00 | (2006.01) |
| H03K 3/037 | (2006.01) |
| H03K 5/22 | (2006.01) |
| H03L 7/081 | (2006.01) |
| H03L 7/087 | (2006.01) |
| H04L 7/033 | (2006.01) |
| H03L 7/085 | (2006.01) |
| H03L 7/099 | (2006.01) |

(52) U.S. Cl.
CPC .............. *H04L 7/0041* (2013.01); *H03K 3/037* (2013.01); *H03K 5/22* (2013.01); *H03L 7/085* (2013.01); *H03L 7/087* (2013.01); *H03L 7/0816* (2013.01); *H03L 7/0818* (2013.01); *H04L 7/0045* (2013.01); *H04L 7/0332* (2013.01); *H03L 7/0995* (2013.01)

(58) Field of Classification Search
CPC ........... H03L 7/08; H03L 7/083; H03L 7/085; H03L 7/087
USPC ....................................................... 375/371
See application file for complete search history.

(56) References Cited

U.S. PATENT DOCUMENTS

| | | |
|---|---|---|
| 6,674,309 B1 | 1/2004 | Mercer et al. |
| 6,952,431 B1 | 10/2005 | Dally et al. |
| 8,203,368 B2 | 6/2012 | Pelgrom et al. |

(Continued)

OTHER PUBLICATIONS

International Searc Report and Written Opinion—PCT/US2015/010086—ISA/EPO—Mar. 10, 2015.

(Continued)

*Primary Examiner* — Kevin Kim
(74) *Attorney, Agent, or Firm* — Patterson & Sheridan, LLP

(57) ABSTRACT

Certain aspects of the present disclosure provide fully differential phase detectors for use in delay-locked loops, for example. One example phase detecting circuit generally includes a first input for a reference signal; a second input for an input signal to be compared with the reference signal; a set-reset (S-R) latch having a set input, a reset input, a first output, and a second output, and a delay (D) flip-flop having a logic input, a clock input, a reset input, and a logic output. The first input is connected with S-R reset input, the second input is connected with S-R set input, the first S-R output is connected with the D clock input, and the second S-R output is connected with the D reset input. The logic output of the D flip-flop indicates whether the input signal is leading or lagging the reference signal.

20 Claims, 5 Drawing Sheets

(56) References Cited

U.S. PATENT DOCUMENTS

| | | | |
|---|---|---|---|
| 8,536,915 | B1 | 9/2013 | Terrovitis |
| 8,638,145 | B2 | 1/2014 | Searles |
| 8,704,569 | B2 | 4/2014 | Haerle et al. |
| 2001/0043086 | A1* | 11/2001 | Idei et al. ............. 327/12 |
| 2004/0136278 | A1* | 7/2004 | Lee et al. ............. 369/44.25 |
| 2014/0028363 | A1 | 1/2014 | Lim et al. |

OTHER PUBLICATIONS

Majek C., et al., "A programmable CMOS RF frequency synthesizer for multi-standard wireless applications", Circuits and Systems, 2004. NEWCAS 2004. The 2nd Annual IEEE Northeast Workshop on Montreal, Canada Jun. 20-23, 2004, Piscataway, NJ, USA, IEEE, Jun. 20, 2004, pp. 289-292, XP010742512, DOI: 10.1109/NEWCAS.2004.1359088 ISBN: 978-0-7803-8322-7 the whole document.

Djemouai A., et al., "Short locking time FLL and PLL based on a DLL technique", Proceedings of the 43rd IEEE Midwest Symposium on Circuits and Systems : Aug. 8-11, 2000, Lansing Convention Center, Lansing, MI, IEEE Operations Center, Piscataway, NJ, vol. 2, Aug. 8, 2000, pp. 952-955, XP010558660, ISBN: 978-0-7803-6475-2 Section:*Description of the New FLL and PLL*.

* cited by examiner

DIFFERENTIAL BANG-BANG PHASE DETECTOR USING STANDARD DIGITAL CELLS

CLAIM OF PRIORITY UNDER 35 U.S.C. §119

This application claims benefit of U.S. Provisional Patent Application Ser. No. 61/932,088, filed Jan. 27, 2014 and entitled "Differential Bang-Bang Phase Detector Using Standard Digital Cells," which is herein incorporated by reference in its entirety.

TECHNICAL FIELD

Certain aspects of the present disclosure generally relate to radio frequency (RF) electronic circuits and, more particularly, to fully differential phase detectors.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (Rats) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3$^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to fully differential phase detectors, which may be implemented using standard digital cells. Differential phase detectors may be used in a variety of communications devices for a variety of purposes. One example of this is in a multiplying delay-locked loop (MDLL) used to generate an output signal having a frequency that is an integer multiple of a reference signal's frequency.

Certain aspects of the present disclosure provide a phase detecting circuit. The phase detecting circuit generally includes a first input for a reference signal; a second input for an input signal to be compared with the reference signal; a set-reset (S-R) latch having a set input, a reset input, a first output, and a second output; and a delay (D) flip-flop having a logic input, a clock input, a reset input, and a logic input, wherein the first input is connected with the reset input of the S-R latch, wherein the second input is connected with the set input of the S-R latch, wherein the first output of the S-R latch is connected with the clock input of the D flip-flop, and wherein the second output of the S-R latch is connected with the reset input of the D flip-flop, such that the logic output of the D flip-flop indicates whether the input signal is leading or lagging the reference signal.

According to certain aspects, the logic input of the D flip-flop is held to a logic high level.

According to certain aspects, a first inverter may be connected between the first output of the S-R latch and the clock input of the D flip-flop. For certain aspects, a second inverter may also be connected between the second output of the S-R latch and the reset input of the D flip-flop.

According to certain aspects, a first logic AND gate may be connected between the first input and the reset input of the S-R latch. For certain aspects, a second logic AND gate may be connected between the second input and the set input of the S-R latch. In some aspects, the phase detecting circuit may include an enabling input, which may be logically ANDed with the first input at the first logic AND gate and logically ANDed with the second input at the second logic AND gate.

According to certain aspects, the S-R latch is connected with the first and second inputs such that the phase detecting circuit is fully differential.

According to certain aspects, the S-R latch is configured to respond to rising edges of the reference signal and the input signal.

According to certain aspects, the S-R latch includes two cross-coupled logical NAND gates.

Certain aspects of the present disclosure provide a delay-locked loop (DLL). The DLL generally includes an input for a reference signal; an output for a signal delayed with respect to the reference signal; a delay chain comprising one or more delay gates for generating the delayed signal, wherein a last one of the delay gates is connected with the output of the DLL; selection logic connected with the output of the DLL and configured to output a selection signal based on the delayed signal; a multiplexer controlled by the selection signal to select between the reference signal and the delayed signal for outputting to a first one of the delay gates in the delay chain; and a phase detecting circuit for comparing the delayed signal with the reference signal. The phase detecting circuit generally includes an S-R latch having a set input, a reset input, a first output, and a second output; and a D flip-flop having a logic input, a clock input, a reset input, and a logic output, wherein the input of the DLL is connected with the reset input of the S-R latch, wherein the output of the DLL is connected with the set input of the S-R latch, wherein the first output of the S-R latch is connected with the clock input of the D flip-flop, and wherein the second output of the S-R latch is connected with the reset input of the D flip-flop, such that the logic output of the D flip-flop indicates whether the delayed signal is leading or lagging the reference signal.

According to certain aspects, the DLL is a multiplying DLL (MDLL) configured such that the delayed signal at the output of the DLL has a frequency equal that of the reference signal multiplied with a multiplying factor. For certain aspects, the selection logic comprises a counter that increments a value by one with each falling edge of the delayed signal, and the selection logic outputs the selection signal with a logic high level after the value of the counter equals the multiplying factor. With the next rising edge of the delayed signal, the value of the counter is reset to 0, and the selection logic outputs the selection signal with a logic low level.

According to certain aspects, the logic input of the D flip-flop is held to a logic high level.

According to certain aspects, the DLL further includes a first inverter connected between the first output of the S-R latch and the clock input of the D flip-flop and a second inverter connected between the second output of the S-R latch and the reset input of the D flip-flop.

According to certain aspects, the DLL further includes a first logic AND gate connected between the input of the DLL and the reset input of the S-R latch and a second logic AND gate connected between the output of the DLL and the set input of the S-R latch. In this case, the selection signal may be logically ANDed with the input of the DLL at the first logic AND gate and may also be logically ANDed with the output of the DLL at the second logic AND gate.

According to certain aspects, the S-R latch is connected with the input of the DLL and the output of the DLL such that the phase detecting circuit is fully differential.

According to certain aspects, the S-R latch is configured to respond to rising edges of the reference signal and the delayed signal.

Certain aspects of the present disclosure provide an apparatus for wireless communications. The apparatus generally includes at least one antenna; and at least one of a receiver for receiving, or a transmitter for transmitting, a signal via the at least one antenna, wherein the at least one of the receiver or the transmitter comprises a delay-locked loop (DLL). The DLL typically includes an input for a reference signal; an output for a signal delayed with respect to the reference signal; a delay chain comprising one or more delay gates for generating the delayed signal, wherein a last one of the delay gates is connected with the output of the DLL; selection logic connected with the output of the DLL and configured to output a selection signal based on the delayed signal; a multiplexer controlled by the selection signal to select between the reference signal and the delayed signal for outputting to a first one of the delay gates in the delay chain; and a phase detecting circuit for comparing the delayed signal with the reference signal. The phase detecting circuit generally includes an S-R latch having a set input, a reset input, a first output, and a second output; and a D flip-flop having a logic input, a clock input, a reset input, and a logic output, wherein the input of the DLL is connected with the reset input of the S-R latch, wherein the output of the DLL is connected with the set input of the S-R latch, wherein the first output of the S-R latch is connected with the clock input of the D flip-flop, and wherein the second output of the S-R latch is connected with the reset input of the D flip-flop, such that the logic output of the D flip-flop indicates whether the delayed signal is leading or lagging the reference signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
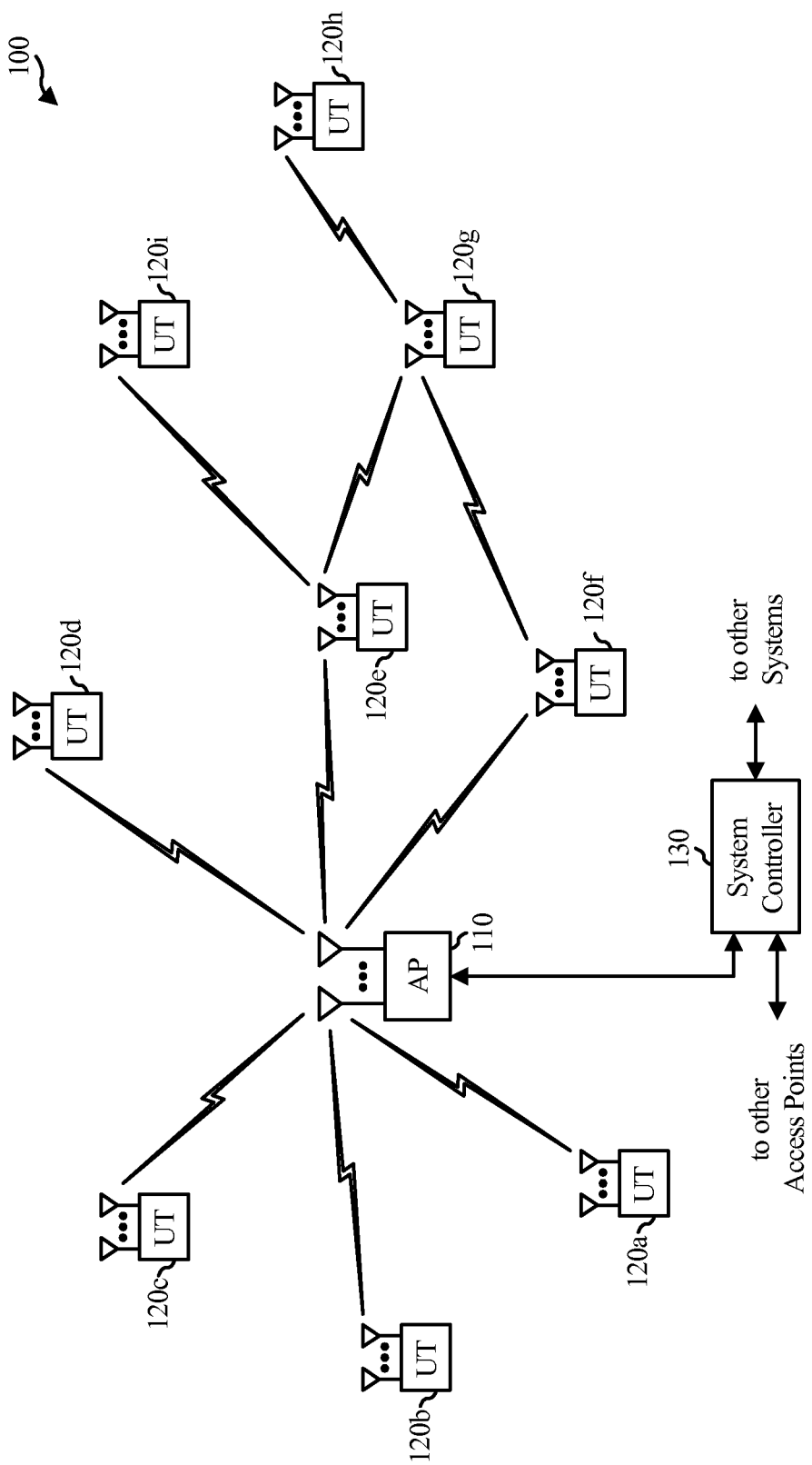
FIG. 1 illustrates an example wireless communications network in accordance with certain aspects of the present disclosure.

FIG. 1 illustrates a wireless communications system 100 with access points and user terminals. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
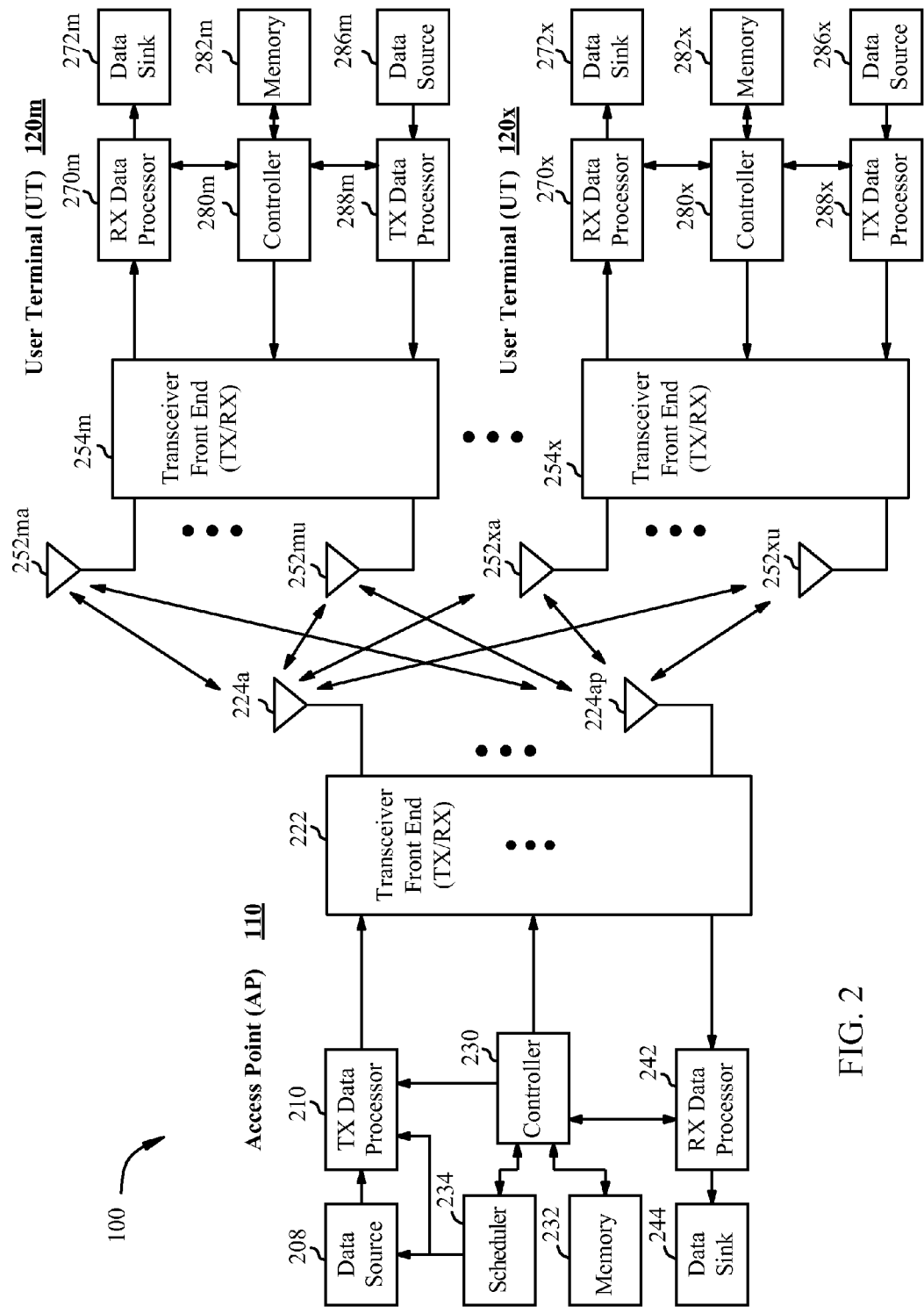
FIG. 2 is a block diagram of an example access point (AP) and user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
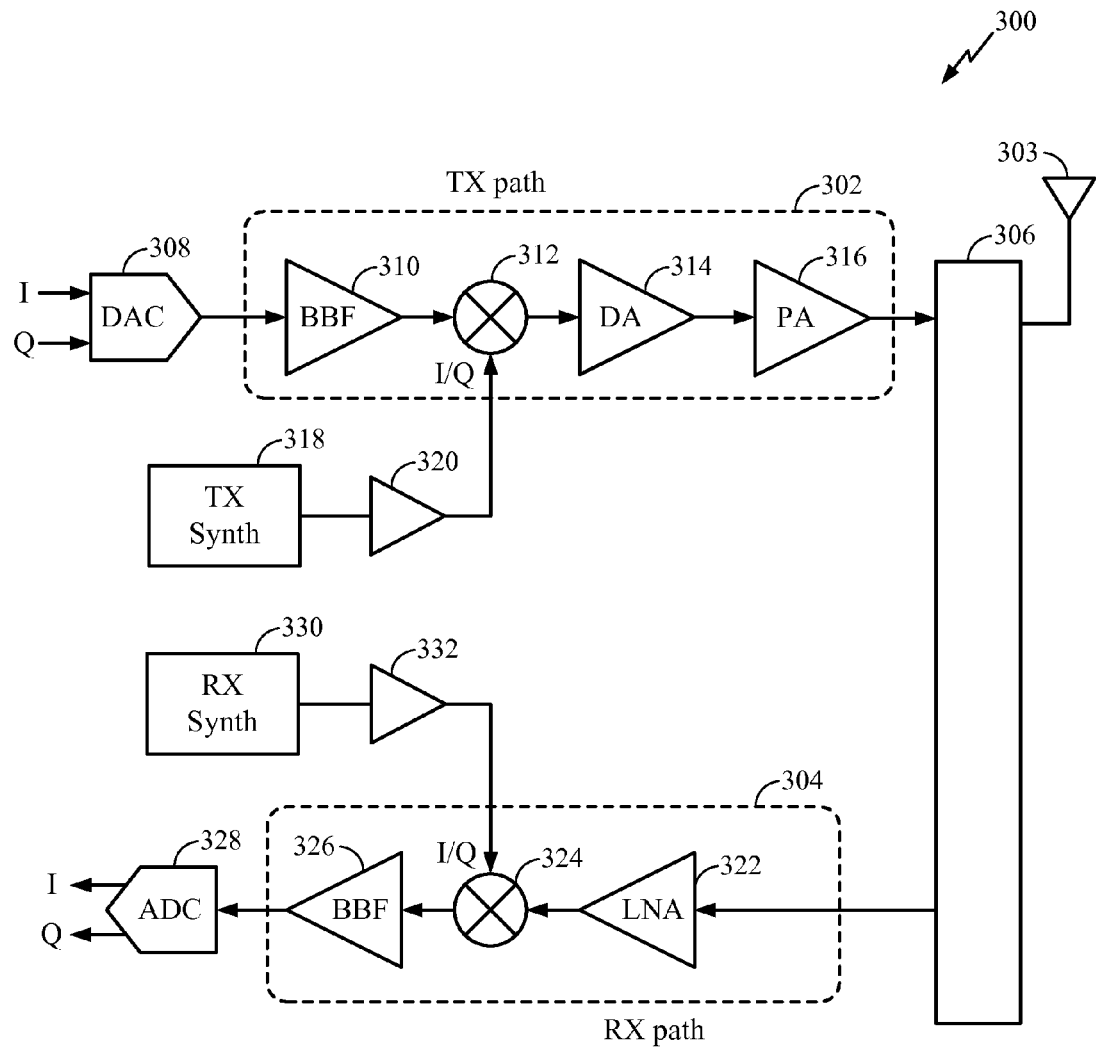
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RF path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Fully Differential Phase Detector

Figure 4:
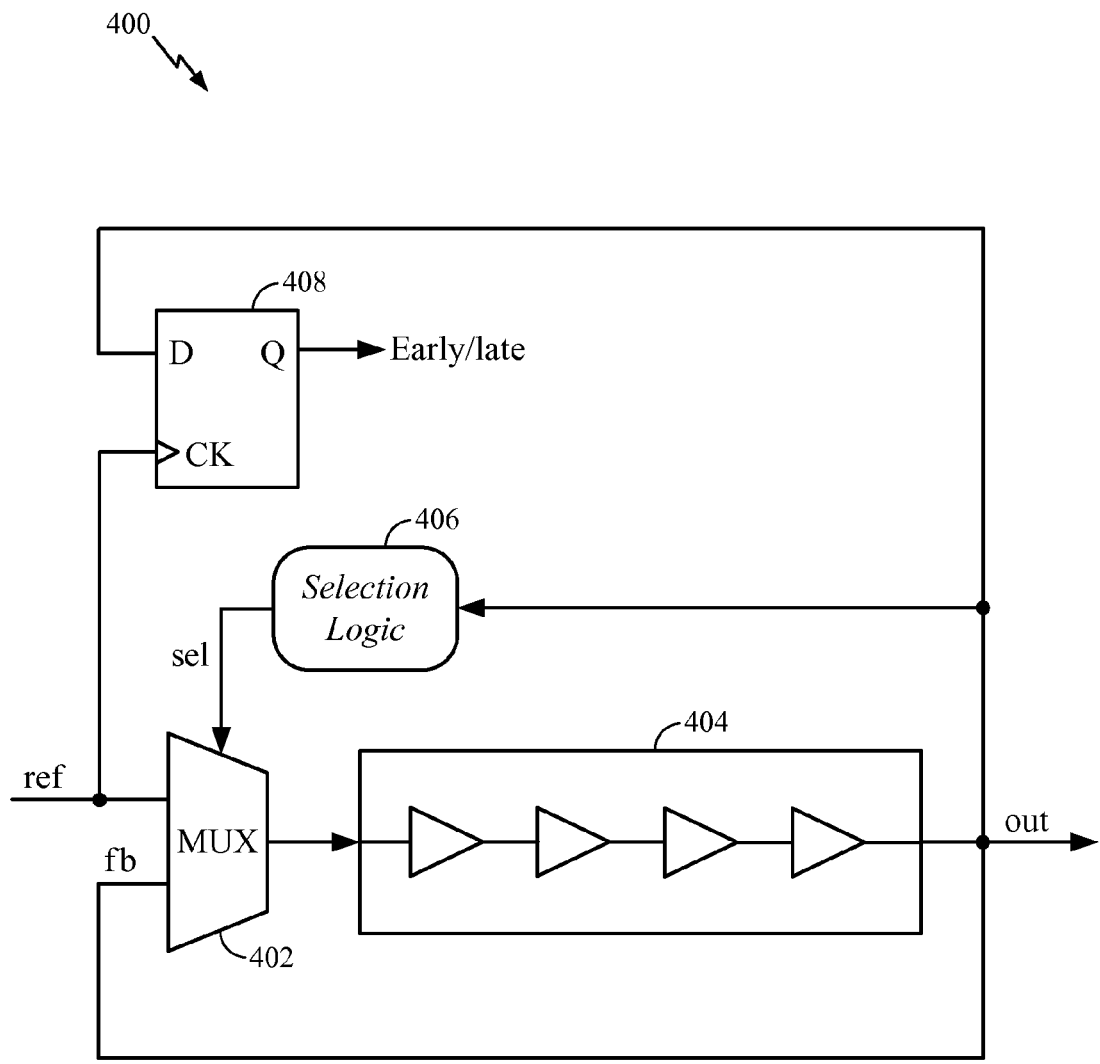
FIG. 4 is a block diagram of an example multiplying delay-locked loop (MDLL) using a delay (D) flip-flop as a phase detector, in accordance with certain aspects of the present disclosure.

A multiplying delay-locked loop (MDLL) may be used to generate an output signal having a frequency that is an integer multiple of a reference signal's frequency. FIG. 4 is a block diagram of an example MDLL 400 using a delay (D) flip-flop as a phase detector. A multiplexer 402 may receive as input a reference signal (ref) and a feedback signal (fb) from a delay line 404. The multiplexer 402 may be controlled by a selection signal (sel) from a selection logic block 406, which dictates outputting either the reference signal or the delay line feedback to the delay line 404. If the reference signal is selected, the delay line 404 may be triggered by an edge of the reference signal. If the feedback signal is selected, the delay line 404 may function as an oscillator. To frequency multiply a signal with the MDLL, the $M^{th}$ edge is replaced by an edge of the reference signal, and the $M^{th}$ edge is compared with the reference edge to adjust the delay of the delay line.

The reference signal and the delay line feedback may be provided to a phase detector 408, such as a bang-bang phase detector, which is typically implemented with a delay (D) flip-flop as shown. At the phase detector 408, the reference signal may be used as a clock input to the D flip-flop, and the delay line feedback may be used as a data input. In this manner, the phase detector 408 effectively compares the edges of the reference signal and the delay line feedback, and the Q output of the D flip-flop indicates whether the delay line feedback is leading, lagging, or in-phase with the reference signal. Based on the comparison, the delay of delay line 404 may be adjusted.

Implementing the phase detector 408 with a D flip-flop does not provide a fully differential design. Therefore, the phase detector may have an offset, which may introduce a finite phase/delay error when locked. This may increase the reference spur level in the MDLL and may contribute, sometimes significantly, to clock jitter in the DLL.

Accordingly, what is needed is a fully differential phase detector that may be used in a phase-locked loop (PLL) or DLL to avoid clock jitter therein and eliminate a deterministic input offset to reduce the reference spur level.

Certain aspects of the present disclosure provide a fully differential phase detecting circuit using standard digital cells, which may eliminate the offset and reduce the reference spur level. To implement a fully differential phase detector, a set-reset (S-R) latch topology may be employed, which has a balanced structure. Further, as feedback edges from the MDLL may have a higher frequency than the reference edges, the phase detector may be designed to select the correct feedback edge to compare with the reference edge. In addition, since S-R latches may be level sensitive, an S-R latch employed in a phase detector may respond only to rising edges of both reference and feedback signals.

Figure 5:
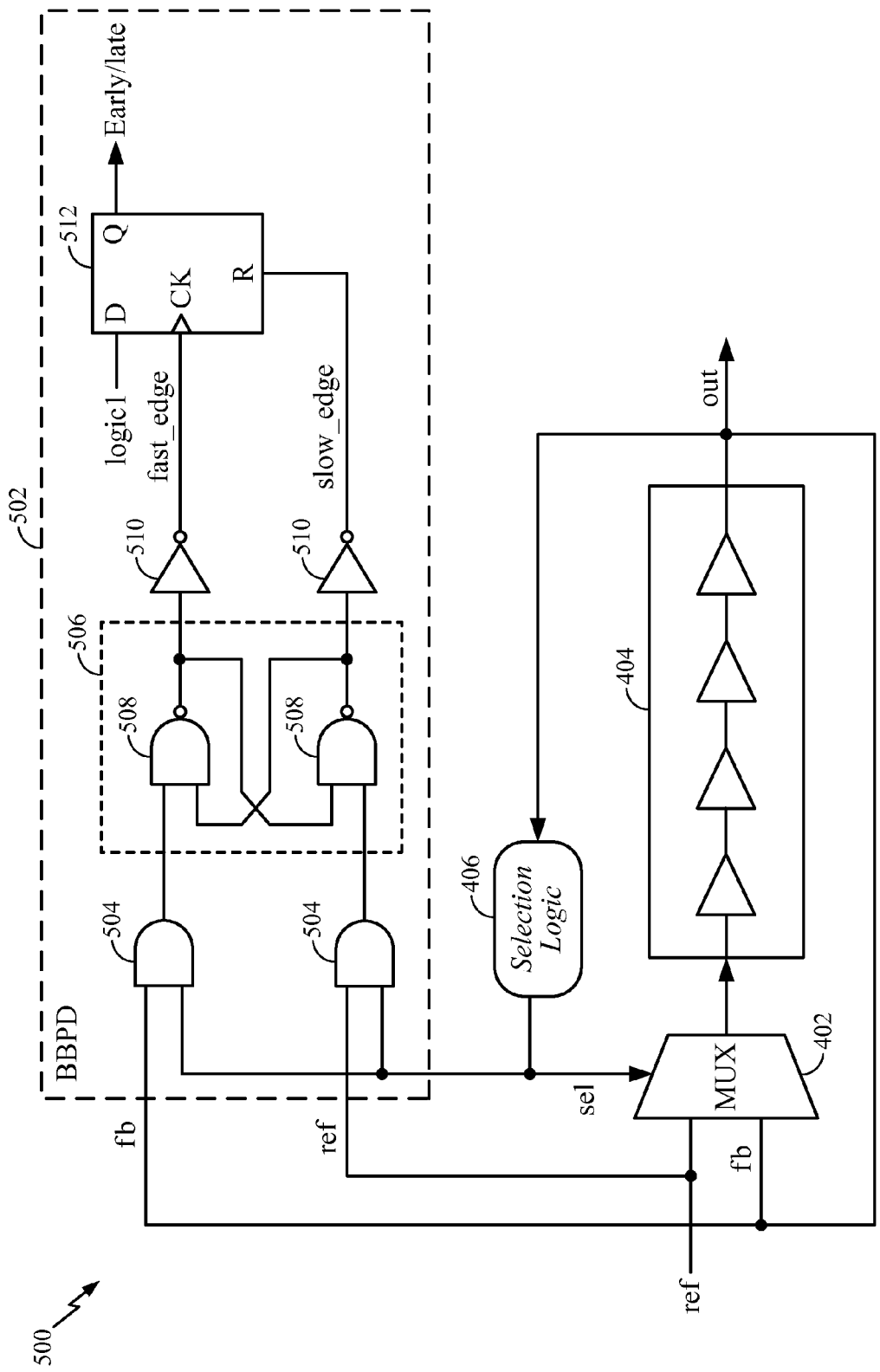
FIG. 5 is a block diagram of an example MDLL using a fully differential bang-bang phase detector (BBPD), in accordance with certain aspects of the present disclosure.

FIG. 5 is a block diagram of an example MDLL 500 implemented with a fully differential phase detecting circuit, according to an aspect of the present disclosure. The MDLL 500 may include a multiplexer 402, a delay line 404, a selection logic block 406, and a bang-bang phase detector (BBPD) 502. The multiplexer 402, the delay line 404, and the selection logic block 406 may function as described above. The logic AND gates 504 at the input of the BBPD 502 may gate the reference and feedback signals by re-using the selection signal, which chooses the correct edge for the comparison. The outputs of the AND gates 504 are provided as the inputs to an S-R latch 506 (e.g., consisting of cross-coupled NAND gates 508) having a first and a second output. The first and second outputs may be inverted by logic inverters 510 and provided to a flip-flop, which may, for example, be a delay (D) flip-flop

512. For example, the first output from the S-R latch 506 may be provided via a logic inverter 510 to a clock input of the D flip-flop 512, and the second output from the S-R latch may be provided to a reset input of the D flip-flop. The data input of the D flip-flop 512 may be held to a logic high level. Based on the inputs, the logic output of the D flip-flop may indicate whether the delayed signal is leading or lagging the reference signal.

During operation of the BBPD 502, if the feedback signal is earlier than the reference signal, there may be a rising edge on "fast_edge," which may change the output of the D flip-flop 512 to a logic high level (indicating "Early"). In contrast, if the feedback signal is later than the reference signal, there may be a rising edge on "slow_edge," which may reset the D flip-flop 512 to a logic low level (indicating "Late"). Because the D flip-flop 512 reacts only to the rising edge of either "fast_edge" or "slow_edge," if the selection signal goes from high to low, the output of the BBPD 502 may not be affected such that the determination of whether the delayed signal is leading or lagging the reference signal is preserved. In other words, the BBPD 502 may be self-timed to make the proper decision.

Because the BBPD 502 is constructed with standard digital cells (e.g., the AND gates 504, the NAND gates 508 of the S-R latch 506, and the logic inverters 510), the phase detector is easy to port into different process nodes.

For certain aspects, the AND gates 504 in the BBPD 502 may be replaced with tri-state buffers, with pull-down resistors at the outputs of the buffers.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252$ma$ through 252$mu$ of the user terminal 120$m$ portrayed in FIG. 2 or the antennas 224$a$ through 224$ap$ of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252$ma$ through 252$mu$ of the user terminal 120$m$ portrayed in FIG. 2 or the antennas 224$a$ through 224$ap$ of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A phase detecting circuit, comprising:
    a first input for a reference signal;
    a second input for an input signal to be compared with the reference signal;
    a set-reset (S-R) latch having a set input, a reset input, a first output, and a second output; and
    a delay (D) flip-flop having a logic input, a clock input, a reset input, and a logic output, wherein the first input is connected with the reset input of the S-R latch, wherein the second input is connected with the set input of the S-R latch, wherein the first output of the S-R latch is connected with the clock input of the D flip-flop, and wherein the second output of the S-R latch is connected with the reset input of the D flip-flop, such that the logic output of the D flip-flop indicates whether the input signal is leading or lagging the reference signal.

2. The circuit of claim 1, wherein the logic input of the D flip-flop is held to a logic high level.

3. The circuit of claim 1, further comprising a first inverter connected between the first output of the S-R latch and the clock input of the D flip-flop.

4. The circuit of claim 3, further comprising a second inverter connected between the second output of the S-R latch and the reset input of the D flip-flop.

5. The circuit of claim 1, further comprising a first logic AND gate connected between the first input and the reset input of the S-R latch.

6. The circuit of claim 5, further comprising a second logic AND gate connected between the second input and the set input of the S-R latch.

7. The circuit of claim 6, further comprising an enabling input, which is logically ANDed with the first input at the first logic AND gate and is logically ANDed with the second input at the second logic AND gate.

8. The circuit of claim 1, wherein the S-R latch is connected with the first and second inputs such that the phase detecting circuit is fully differential.

9. The circuit of claim 1, wherein the S-R latch is configured to respond to rising edges of the reference signal and the input signal.

10. The circuit of claim 1, wherein the S-R latch comprises two cross-coupled logical NAND gates.

11. A delay-locked loop (DLL), comprising:
    an input for a reference signal;
    an output for a signal delayed with respect to the reference signal;
    a delay chain comprising one or more delay gates for generating the delayed signal, wherein a last one of the delay gates is connected with the output of the DLL;
    selection logic connected with the output of the DLL and configured to output a selection signal based on the delayed signal;
    a multiplexer controlled by the selection signal to select between the reference signal and the delayed signal for outputting to a first one of the delay gates in the delay chain; and
    a phase detecting circuit for comparing the delayed signal with the reference signal, comprising:
        a set-reset (S-R) latch having a set input, a reset input, a first output, and a second output; and
        a delay (D) flip-flop having a logic input, a clock input, a reset input, and a logic output, wherein the input of the DLL is connected with the reset input of the S-R latch, wherein the output of the DLL is connected with the set input of the S-R latch, wherein the first output of the S-R latch is connected with the clock input of the D flip-flop, and wherein the second output of the S-R latch is connected with the reset input of the D flip-flop, such that the logic output of the D flip-flop indicates whether the delayed signal is leading or lagging the reference signal.

12. The DLL of claim 11, wherein the DLL is a multiplying DLL (MDLL) configured such that the delayed signal at the output of the DLL has a frequency equal that of the reference signal multiplied with a multiplying factor.

13. The DLL of claim 12, wherein the selection logic comprises a counter that increments a value by one with each falling edge of the delayed signal, wherein the selection logic outputs the selection signal with a logic high level after the value of the counter equals the multiplying factor, and wherein with the next rising edge of the delayed signal, the value of the counter is reset to 0 and the selection logic outputs the selection signal with a logic low level.

14. The DLL of claim 11, wherein the logic input of the D flip-flop is held to a logic high level.

15. The DLL of claim 11, further comprising:
    a first inverter connected between the first output of the S-R latch and the clock input of the D flip-flop; and
    a second inverter connected between the second output of the S-R latch and the reset input of the D flip-flop.

16. The DLL of claim 11, further comprising:
    a first logic AND gate connected between the input of the DLL and the reset input of the S-R latch; and
    a second logic AND gate connected between the output of the DLL and the set input of the S-R latch.

17. The DLL of claim 16, wherein the selection signal is logically ANDed with the input of the DLL at the first logic AND gate and is logically ANDed with the output of the DLL at the second logic AND gate.

18. The DLL of claim 11, wherein the S-R latch is connected with the input of the DLL and the output of the DLL such that the phase detecting circuit is fully differential.

19. The DLL of claim 11, wherein the S-R latch is configured to respond to rising edges of the reference signal and the delayed signal.

20. An apparatus for wireless communications, comprising:
    at least one antenna; and
    at least one of a receiver for receiving, or a transmitter for transmitting, a signal via the at least one antenna, wherein the at least one of the receiver or the transmitter comprises a delay-locked loop (DLL) comprising:
        an input for a reference signal;
        an output for a signal delayed with respect to the reference signal;
        a delay chain comprising one or more delay gates for generating the delayed signal, wherein a last one of the delay gates is connected with the output of the DLL;
        selection logic connected with the output of the DLL and configured to output a selection signal based on the delayed signal;
        a multiplexer controlled by the selection signal to select between the reference signal and the delayed signal for outputting to a first one of the delay gates in the delay chain; and
        a phase detecting circuit for comparing the delayed signal with the reference signal, comprising:

a set-reset (S-R) latch having a set input, a reset input, a first output, and a second output; and a delay (D) flip-flop having a logic input, a clock input, a reset input, and a logic output, wherein the input of the DLL is connected with the reset input of the S-R latch, wherein the output of the DLL is connected with the set input of the S-R latch, wherein the first output of the S-R latch is connected with the clock input of the D flip-flop, and wherein the second output of the S-R latch is connected with the reset input of the D flip-flop, such that the logic output of the D flip-flop indicates whether the delayed signal is leading or lagging the reference signal.

\* \* \* \* \*